(12) United States Patent
Bertin et al.

(10) Patent No.: US 7,365,632 B2
(45) Date of Patent: Apr. 29, 2008

(54) RESISTIVE ELEMENTS USING CARBON NANOTUBES

(75) Inventors: Claude L. Bertin, South Burlington, VT (US); Thomas Ruckes, Portland, OR (US); Brent M. Segal, Woburn, MA (US); Jonathan W. Ward, Fairfax, VA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 11/230,876

(22) Filed: Sep. 20, 2005

(65) Prior Publication Data

US 2007/0236325 A1   Oct. 11, 2007

Related U.S. Application Data

(60) Provisional application No. 60/611,765, filed on Sep. 21, 2004.

(51) Int. Cl.
*H01C 10/00* (2006.01)
(52) U.S. Cl. .................. 338/195; 338/20; 524/233; 257/414
(58) Field of Classification Search ............ 338/20–21, 338/22 R, 195; 524/99, 233; 706/15; 257/414, 257/9; 711/127; 365/151
See application file for complete search history.

(56) References Cited

U.S. PATENT DOCUMENTS

| | | | |
|---|---|---|---|
| 6,187,823 B1 | 2/2001 | Haddon et al. | |
| 6,331,262 B1 | 12/2001 | Haddon et al. | |
| 6,368,569 B1 | 4/2002 | Haddon et al. | |
| 6,514,113 B1 | 2/2003 | Lee et al. | |
| 6,531,513 B2 | 3/2003 | Haddon et al. | |
| 6,574,130 B2 | 6/2003 | Segal et al. | |
| 6,617,377 B2 * | 9/2003 | Chacko | 524/99 |
| 6,641,793 B2 | 11/2003 | Haddon et al. | |
| 6,643,165 B2 | 11/2003 | Segal et al. | |
| 6,706,402 B2 | 3/2004 | Rueckes et al. | |
| 6,784,028 B2 | 8/2004 | Rueckes et al. | |
| 6,835,591 B2 | 12/2004 | Rueckes et al. | |
| 6,889,216 B2 * | 5/2005 | Nugent | 706/15 |
| 6,911,682 B2 | 6/2005 | Rueckes et al. | |
| 6,919,592 B2 | 7/2005 | Segal et al. | |

(Continued)

FOREIGN PATENT DOCUMENTS

WO    WO-01/03208 A1    1/2001

(Continued)

OTHER PUBLICATIONS

U.S. Appl. No. 10/341,005, Ward et al.

(Continued)

*Primary Examiner*—K. Richard Lee
(74) *Attorney, Agent, or Firm*—Wilmer Cutler Pickering Hale and Dorr LLP

(57) ABSTRACT

Resistive elements include a patterned region of nanofabric having a predetermined area, where the nanofabric has a selected sheet resistance; and first and second electrical contacts contacting the patterned region of nanofabric and in spaced relation to each other. The resistance of the element between the first and second electrical contacts is determined by the selected sheet resistance of the nanofabric, the area of nanofabric, and the spaced relation of the first and second electrical contacts. The bulk resistance is tunable.

63 Claims, 10 Drawing Sheets

U.S. PATENT DOCUMENTS

| | | | |
|---|---|---|---|
| 6,924,538 B2 | 8/2005 | Jaiprakash et al. | |
| 6,963,077 B2* | 11/2005 | DeHon et al. | 257/9 |
| 2003/0177450 A1* | 9/2003 | Nugent | 716/1 |
| 2003/0205966 A1 | 11/2003 | Chen et al. | |
| 2004/0051432 A1 | 3/2004 | Jiang et al. | |
| 2004/0181630 A1* | 9/2004 | Jaiprakash et al. | 711/127 |
| 2005/0053525 A1 | 3/2005 | Segal et al. | |
| 2005/0065741 A1 | 3/2005 | Segal et al. | |
| 2005/0128788 A1* | 6/2005 | Segal et al. | 365/151 |

FOREIGN PATENT DOCUMENTS

| | | | |
|---|---|---|---|
| WO | WO-03/091486 | | 11/2003 |
| WO | WO-04/065655 | | 8/2004 |
| WO | WO-04/065657 | | 8/2004 |
| WO | WO-04/065671 | | 8/2004 |
| WO | WO 2004/072334 | * | 8/2004 |

OTHER PUBLICATIONS

U.S. Appl. No. 10/341,054, Ward et al.
U.S. Appl. No. 10/341,055, Ward et al.
U.S. Appl. No. 10/341,130, Ward et al.
Chen, J. et al., "Solution Properties of Single-Walled Carbon Nanotubes," *Science*, Oct. 2, 1998, vol. 282, pp. 95-98.
Freitag, M. et al., "Photoconductivity of Single Carbon Nanotubes," *Nano Letters*, Jun. 6, 2003, vol. 3, No. 8, pp. 1067-1071.
Georgakilas, V., "Organic Functionalization of Carbon Nanotubes," *J. Am. Chem. Soc.*, Jan. 8, 2002, vol. 124, No. 5, pp. 760-761.
Imholt, T. J., "Nanotubes in Microwave Fields: Light Emission, Intense Heat, Outgassing, and Reconstructin," Downloaded from Web, 2004, pp. 1-2.
Islam, M. F. et al. "High Weight Fractin Surfactant Solubilization of Single-Wall Carbon Nanotubes in Water," *Nano Letters*, Jan. 16, 2003, vol. 3, No. 2, pp. 269-273.
Javey, A. et al., "Ballistic Carbon Nanotube Field-Effect Transistors", *Nature*, vol. 424, pp. 654-657, 2003.
Javey, A. et al., "High-Field Quasiballistic Transport in Short Carbon Nanotubes", *Phys. Rev. Lett.*, vol. 92, No. 10, pp. 106804-1 - 106804-4, 2004.
Kong, J. et al., "Quantum Interface and Ballistic Transmission in Nanotube Electron Waveguides", *Phys. Rev. Lett.*, vol. 87, No. 10, pp. 106801-1 - 106806-4, 2001.
Li, Peng et al. " Polarized Incadescent light emissin from carbon nanotubes," *Applied Physics Letters* , Mar. 17, 2003, vol. 81, No. 11, pp. 1763-1765.
Liu, A. et al., "A High-Speed Silicon Optical Modulator Based on a Metal-Oxide-Semiconductor Capacitor," *Nature*, Feb. 12, 2004, vol. 427, pp. 615-618.
Misewich, J. A. et al., "Electrically Induced Optical Emission from a Carbon Nanotube FET," *Science*, May 2, 2003, vol. 300, pp. 783-786.
Moore, V.C., "Individually Suspended Single-Walled Carbon Nanotubes in Various Surfactants," *Nano Letters*, Sep. 9, 2003, vol. 3, No. 10, pp. 1379-1382.
Multifunction Carbon Nanotube Composites, http://www.orni.gov/~odg/compositesmain.html, printed May 20, 2004, pp. 1-5.
Pompeo, F. et al., "Water Solubilization of Single-Walled Carbon Nanotubes by Functinalization with Flucosamine," *Nano Letters*, Jan. 26, 2002, vol. 2, No. 4, pp. 369-373.
Purcell, S. T. et al., "Hot Nanotubes: Stable Heating of Individual Mutiwall Carbon Nanotubes to 2000 K Induced by the Field-Emission Current," *Physical Review Letters*, Mar. 11, 2002, vol. 88, No. 1, pp. 105502-1-105502-4.
Reed, G. T., "The optical age of silicon," *Nature*, Feb. 12, 2004, vol. 427, pp. 595-596.
Riggs, J. E. et al., "Strong Luminescence of Solubilized Carbon Nanotubes," *J. Am. Chem. Soc.* Jun. 2, 2000, vol. 122, pp. 5879-5880.
Rotkin, S.V., "Theory of Nanotubes Nanodevices," Published on Web Oct. 11, 2002, pp. 1-22.
Shim, M. et al., "Photoinduced conductivity changes in carbon nanotube transistors," *Applied Physics Letters*, Oct. 27, 2003, vol. 83, No. 17, pp. 3564-3566.
Sun, Y. P. et al., "Soluble Dendron-functionalization Carbon Nanotubes: Preparation, Characterization, and Properties," *Chem. Mater.*, Aug. 24, 2001, vol. 13, pp. 2864-2869.
Sun, Y., "High Dissolution and Strong ELight Emission of Carbon nanotubes in Aromatic Amine Solvents," *J. Am. Chem.Soc.* May 11, 2001, vol. 123, pp. 5348-5349.
Sveningsson, M. et al., "Blackbody radiation from resistively heated multiwalled carbon nanotubes during field emission," *Applied Physics Leters*, Aug. 5, 2002, vol. 81, No. 8, pp. 1095-1097.
Tong, L., et al., "Subwavelength-diameter silica wires for low-loss optical wave guidling,".
Vincent, P. et al., "Modelizatin of Resistive Heating of Carbon Nanotubes during Field Emission," *Physical Review B.*, Aug. 6, 2002, vol. 66, pp. 075406-1 - 075406.5.
Wei, Jinquan et al., "Carbon nanotube filaments in household light bulbs," *Applied Physics Letters*, Jun. 14, 2004, vol. 84, No. 24, pp. 4869-4871.

* cited by examiner 400
412

413 (inset)

402
414

404
416

RESISTIVE ELEMENTS USING CARBON NANOTUBES

CROSS-REFERENCE TO RELATED APPLICATIONS

This application claims priority under 35 U.S.C. §119(e) to the following application, the contents of which are incorporated herein in their entirety by reference:

U.S. Provisional Patent Application No. 60/611,765, filed on Sep. 21, 2004, entitled Resistive Elements Using Carbon Nanotubes.

BACKGROUND

1. Technical Field

The present application relates generally to the field of thin film resistors, both in integrated circuits and as discrete resistors, more specifically to thin film resistors with improved temperature independence, and even more specifically to thin film resistors fabricated from carbon nanotube fabrics.

2. Discussion of Related Art

Thin film resistors are used in many important technological applications as parts of electronic circuits. Thin film resistors may be integrated into complex hybrid circuitry, and/or they may be used as discrete devices. For example, thin film resistors can be used in integrated circuits as the resistive ladder network in an analog-to-digital converter, and as current limiting and load resistors in emitter follower amplifiers.

Currently, thin film resistors are fabricated using a variety of materials including tantalum nitride (TaN), silicon chromium (SiCr) and nickel chromium (NiCr).

In general, the resistance of a material changes with temperature; this property can be quantified as the temperature coefficient of resistance (TCR) for a given material. For example, as the material of a resistor is heated, the resistance of the material may rise. For example, the TCR of NiCr thin film resistors is on the order of 120 ppm/degree C. This relatively large TCR means that a small temperature variation across a data converter could detune the device, e.g., change a specifically tuned resistance value of the device. When tuning the resistance of a device is imperative, then the TCR must be kept to a minimum.

Some presently available high performance thin-film resistors are capable of exhibiting low TCRs, but their applicability is limited because they are not able to carry large currents. Currently, high performance thin film metal resistors are approximately 1-5 atoms thick and have sheet resistances measuring approximately 1-2 K-Ohms per square. Such resistors can support a current of up to approximately 20 u-Amps /micron width. Large resistance values in excess of 100 K-Ohms are difficult to design are difficult to design and fabricate.

Thin film resistors, typically on a substrate (carrier), may be backside mounted, that is, they may be mechanically attached to the next level of electronic assembly, and may be wirebonded for electrical interconnection. Typically, wire bond electrical connections have a low resistance in the milliohm range and an inductance of 1.5 to 2 nanoHenries (nH). Alternatively, thin film resistors, typically on a substrate (carrier), may include terminal metallurgy and a conductive bump, and may be surface mounted to the next level of assembly using well known flip-chip techniques. The conductive bumps provide both mechanical and electrical connections to the next level of assembly. Typically, electrical connections using conductive bumps have a low resistance in the milliohm range and a low inductance typically less than 0.5 nanoHenries (nH).

Parasitic capacitances and inductances associated with thin film resistor values are a function of the length and width of the thin film resistor. If the thin film resistor is in the proximity of one or more conductive planes (such as a substrate, for example), then parasitic capacitances and inductances associated with the resistor are determined by the length and width of the thin film resistor, and the distance from one or more conductor reference planes. Parasitic capacitance and inductance values are reduced as the thin film resistor size is reduced, thus, higher sheet resistance thin films are more desirable for higher resistance values (10 K-Ohm to 100 K-Ohm and above resistors, for example).

Single walled carbon nanotubes exhibit quasiballistic electron transport at room temperature. This property of nanotubes lends itself to conductivity with very low resistance. See Kong, Jing et al., "Quantum Interference and Ballistic Transmission in Nanotube Electron Waveguides", *Phys. Rev. Lett.*, 2001, 87 (10) 106801-1-106801-4; Javey, Ali et al., "High-Field Quasiballistic Transport in Short Carbon Nanotubes", *Phys. Rev. Lett.*, 2004, 92 (10) 106804-1-106804-4; Javey, Ali et al., "Ballistic Carbon Nanotube Field-Effect Transistors", *Nature*, 2003, 424, 654-657.

Carbon nanotubes exhibit electrical characteristics appropriate for use in numerous devices. Rueckes et al. have described non-woven conductive fabric made from carbon nanotubes in U.S. Pat. Nos. 6,706,402 and 6,835,591; also see U.S. patent application Ser. Nos. 10/341,005, 10/341,054, 10/341,055 and 10/341,130. Such films are used, for example, as elements in memory cells, see U.S. Pat. No. 6,706,402, and as sensor elements. See U.S. patent application Ser. Nos. 10/844,913 and 10/844,883. Their conductive and semiconductive properties also make them suitable for other uses in the electronics industry.

SUMMARY

The present invention provides resistive elements using carbon nanotubes. The inventors have appreciated that carbon nanotubes can be used in miniaturized low-TCR resistive elements having improved parameter control and associated increased function per device. They may be used, for example, to extend battery life, improve signal integrity, offer performance gains and other advantages depending on the application. By using high-ohm miniature resistors with low-current consumption, extended battery life may be achieved in medical applications such as implantable and portable devices that rely on extended battery life. Military requirements for miniaturized portable next generation radio, GPS, and command-and-control systems also may use thin film resistors to improve signal integrity and maximize system performance (per send-and-receive watts) by maximizing battery life. Test-and-measurement devices now require speeds in excess of 100 GHz and require miniature thin film resistors with low parasitic capacitance and inductance values to achieve reproducible test results.

Under one aspect of the invention, a resistive element includes a patterned region of nanofabric with predefined area, the nanofabric having a selected sheet resistance. First and second electrical contacts contacting the patterned region of nanofabric and in spaced relation to each other. The resistance of the element between the first and second electrical contacts is determined by the selected sheet resistance of the nanofabric and the predetermined area and the spaced relation of the first and second electrical contacts. The bulk resistance of the element is tunable.

DETAILED DESCRIPTION

Resistors with very low TCRs are useful for many devices, especially those that require temperature independent performance, such as voltage regulators and data converters. Resistive elements using carbon nanotubes, fabrics, films and elements generally have a low TCR, a high current carrying capacity, and a controllable and tunable resistance. Additionally, they can be fabricated using techniques that are compatible with existing semiconductor processes. In other words, resistive elements using carbon nanotubes can be adapted for use in numerous applications.

Nanotube films can be routinely and uniformly fabricated to have sheet resistances from, for example, 1 K-Ohm/square to 1 M-Ohm/square. The resistive elements of the present invention can be characterized as having the ability to carry a current of up to about 1 milliamp per micron width.

Figure 1A:
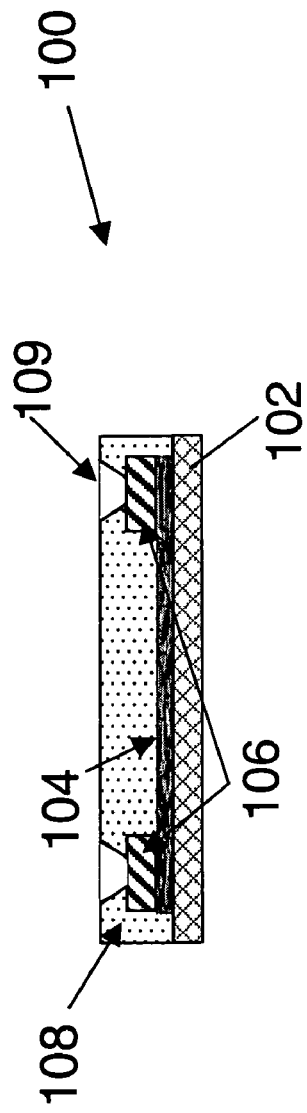
FIGS. 1A-1B and illustrate a resistive element according to one embodiment of the invention.

FIG. 1A illustrates a cross section of a discrete nanofabric-based resistive element according to one aspect of the present invention. The resistive element 100 includes a substrate 102, a patterned nanotube-based fabric (patterned nanofabric) 104, electrical contacts 106, a passivation layer 108, and an opening 109 in passivation layer 108 to expose a portion of electrical contacts 106 for electrical contact to other electronic components on the same substrate layer, or to another level of assembly.

The substrate 102 is made of silicon for simple fabrication using current CMOS technology, however other embodiments may use substrates of many different materials as described below.

The patterned nanofabric 104 is disposed on substrate 102. The sheet resistance of the patterned nanofabric element 104 is controlled by controlling the porosity of the nanofabric, or a density of nanotubes in the fabric, along with other variables. The nanofabric can be applied to a surface in a reliably uniform manner such that the electric properties of the nanofabric can be controlled/tuned. The patterned nanofabric 104 can be reliably tuned to have a sheet resistance from about 1 K-Ohm/square to about 1 M-Ohm/square.

In some embodiments, the nanotube fabric is a fabric of matted carbon nanotubes (or nanofabric). In some embodiments, the nanofabric is porous. In some embodiments, the nanofabric includes single-walled nanotubes (SWNT) and/or multi-walled nanotubes (MWNT). The nanofabric can be a monolayer of nanotubes, or multiple layers of nanofabric can be fabricated with other appropriate techniques. That is, preferred embodiments do not require a nanofabric that is necessarily a monolayer of nanotubes. The sheet resistance of the nanofabric can be monitored after applying a layer, and if necessary one or more additional layers of nanofabric can be deposited in order to bring the sheet resistance to a desired value.

Contacts 106 may be used for contact purposes only, or may be provide both contact and interconnect function as shown below. Contacts 106 may be formed as one conductor material in contact with nanofabric layer 104 as illustrated in FIG. 1A. Alternatively, contacts 106 may be fabricated as two layers (not shown) such that a lower-region in contact with nanofabric layer 104 is optimized for low contact resistance using conductors such as tungsten, titanium, chromium, or palladium, and an upper-region in contact with (or as part of on-chip wiring) or in contact with another level of electronic assembly through a conductive means such as a wirebond, for example, is optimized for electrode (terminal) contact and wiring using such conductors as tungsten, aluminum, copper, and other conductors. Typical contacts 106 thickness will be in range of 30 to 600 nm.

Passivation layer 108 is shown covering the resistive fabric 104 and electrical contacts 106. Typical passivation layers are composed of $SiO_2$, $SiO_2$ and a $Si_3N_4$ barrier layer, polyimide, $Al_2O_3$, or other well known passivation layers in the thickness range, for example, of 100 to 1000 nm.

The bottom region of contacts 106 electrically contact patterned nanofabric 104, and the top region of contact 106 electrically contacts another electronic component, such as an electrode, through opening 109. An electrical interconnection between the nanotube fabric 104 and the next level of assembly may be made by contacts 106, such as by wirebond contacting the top-regions of contacts 106, to conductors or electrodes in the next level of assembly. Alternatively, electrical and mechanical connection to the next level of assembly may be made using flip chip conductive bump technology as shown below. Alternatively, resistive element 100 may be part of an integrated circuit chip, connected to another level of assembly through contact 106 as shown below, and also connected to other on-chip components using conductive chip traces of aluminum or copper, for example, connected to contact 106 on-chip. Alternatively, contacts 106 may be used as both contact and wiring layer as part of an integrated circuit chip and not require opening 109 to interconnect with other components on the integrated circuit chip or to another level of assembly.

The resistance of a resistive element is controlled by factors including the fabric density corresponding to sheet resistance (in terms of Ohms per square), the length and width of the nanofabric region, plus the contact resistance between the contact and the carbon nanotubes, and any other appropriate means such as laser scribing used to adjust (trim) the final resistance value. For higher resistor values of about 10 K-Ohm to 100 K-Ohm and above, the contact resistance is negligibly small compared to the resistor value.

Figure 1B:
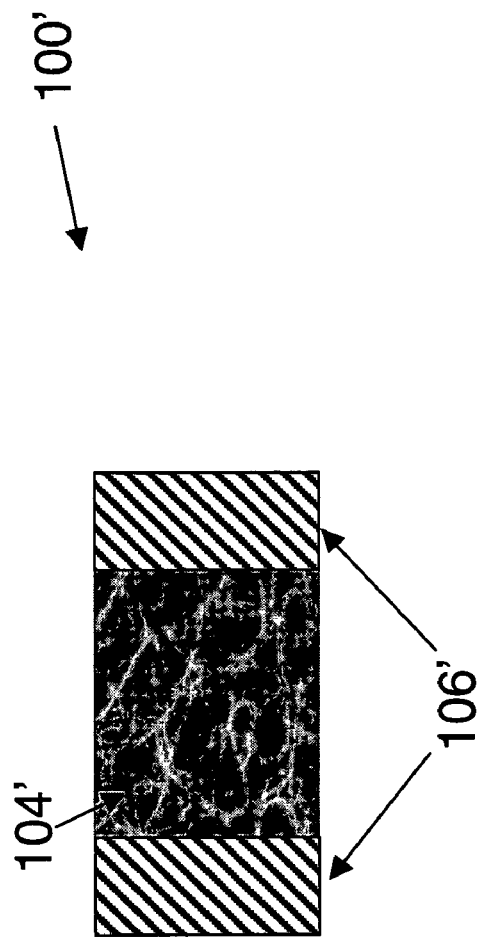

FIG. 1B illustrates a plan view of the resistive element 100', with passivation layer 108 not shown for the sake of clarity.

Figure 2:
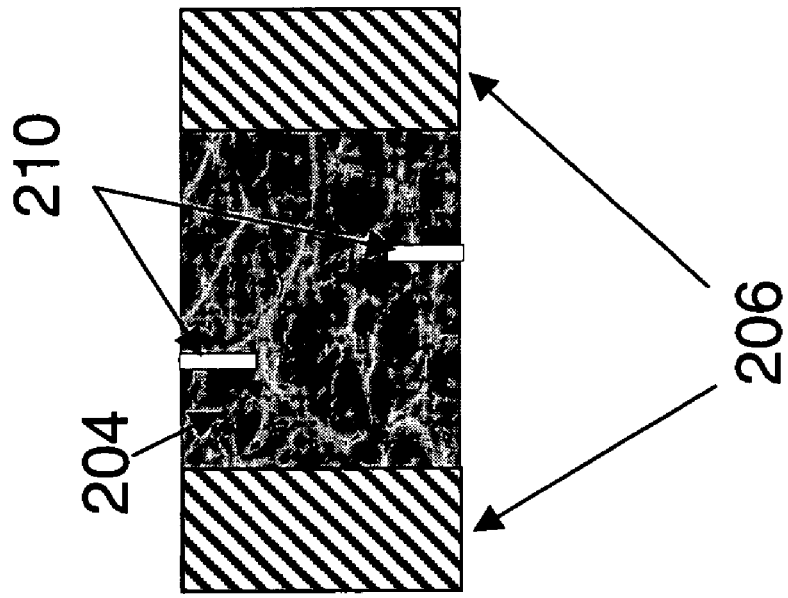
FIG. 2 illustrates a resistive element according to certain embodiments of the invention.

FIG. 2 illustrates a resistive fabric 204 which has been mechanically scribed, laser scribed, or altered by another means to tune the final resistance value. Cuts 210 may be made by a preferred laser method to tune the resistance; laser scribing is used currently to tune the resistances of thin film resistors and is well-known in the art. The contact resistance to the next level of assembly is negligible by comparison. One skilled in the art will appreciate that many different metals (see above) and combinations of metals may be used as contact terminals, however care must be taken to control for contact resistance.

Thin film resistive elements may be fabricated into discrete units or they may be integrated into circuitry by using a semiconductor-compatible thin film resistor process. The overall resistance of the element is determined by the sheet resistance of the nanofabric, the width and length dimensions, in addition to the contact resistance of the nanofabric and contact layers, described more fully below.

In order to fabricate a resistive element according to one embodiment of the present invention, a nanofabric is created on a substrate. Nanofabrics may be created by any appropriate means including but not limited to: chemical vapor deposition (CVD), aerosol application, spray coating, dipping, spin coating, etc. The sheet resistance of the nanofabric can be tuned by adjusting the porosity of the nanofabric. Once created, the nanofabric can be patterned, e.g., by etching, and it can be trimmed for greater resistor precision by resistance tuning, prior to passivation. Trimming may be done by mechanical scribing or laser scribing or by any appropriate means. Contacts are applied to the nanofabric, e.g., by sputtering or other deposition means. Although in the illustrated embodiment, the contacts are deposited on top of the nanofabric, in general the relative orientation of contacts and nanofabric is fairly flexible. Generally the contacts need to be in physical contact with the nanofabric. For example, the nanofabric could be disposed on one or both of the contacts. A passivation layer is applied to protect the resistive elements and thereby ensure that their resistive properties are not unduly altered, and the resistive elements are packaged as appropriate, either discretely or integrated into circuitry.

Figure 3A:
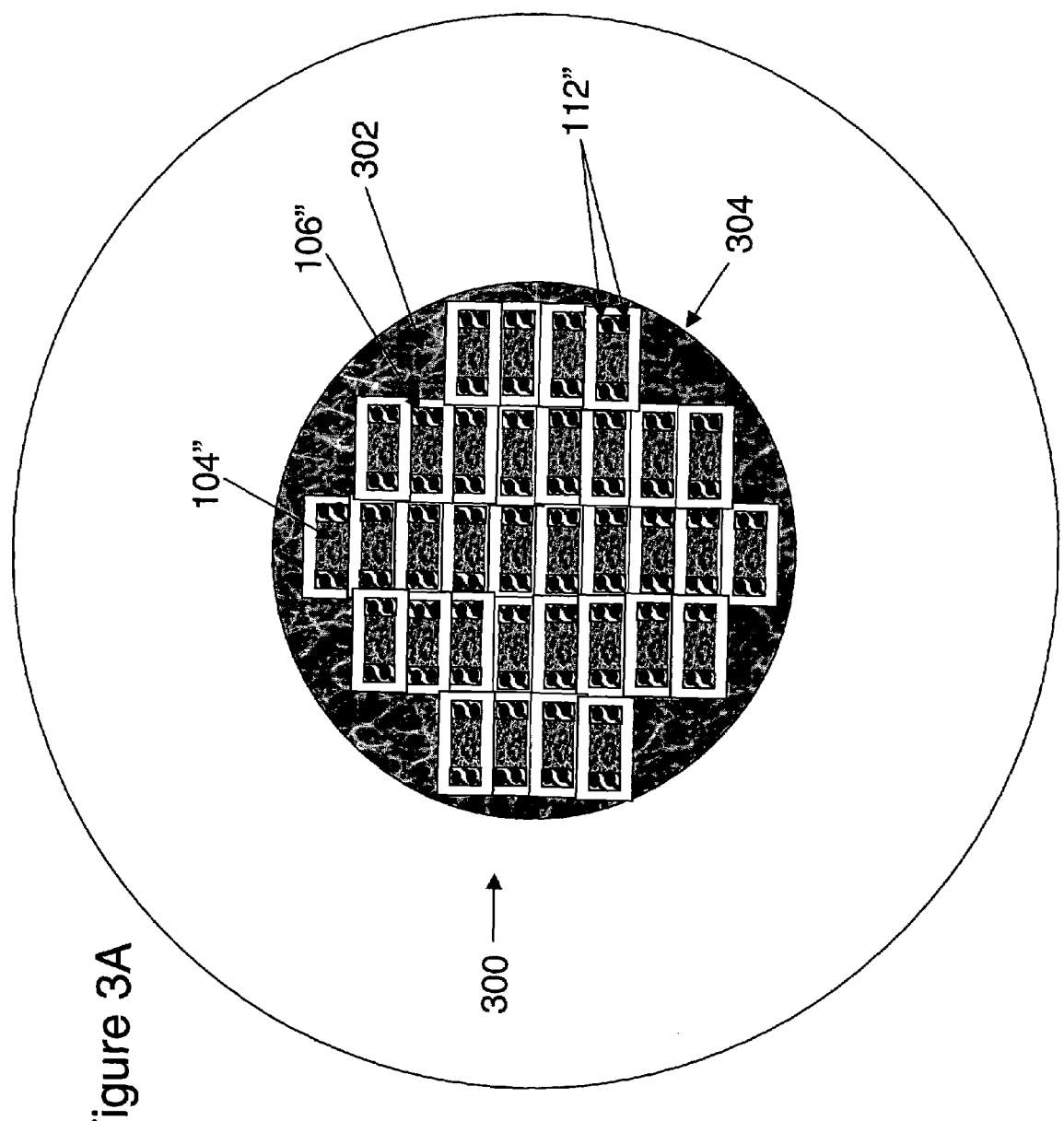
FIG. 3A illustrates an array of patterned resistive elements according to certain embodiments of the invention.

FIG. 3A illustrates an array 300 of patterned nanofabric resistive elements 104" formed from a nanofabric layer 302 on a substrate 304 (a silicon wafer, for example) with contacts 106" and terminals 112" contacting contacts 106" in place. The sheet resistance of the nanofabric layer 302 will typically be in the range of 1 K-Ohms per square to 1 M-Ohms per square.

EXAMPLE 1

Figure 3B:
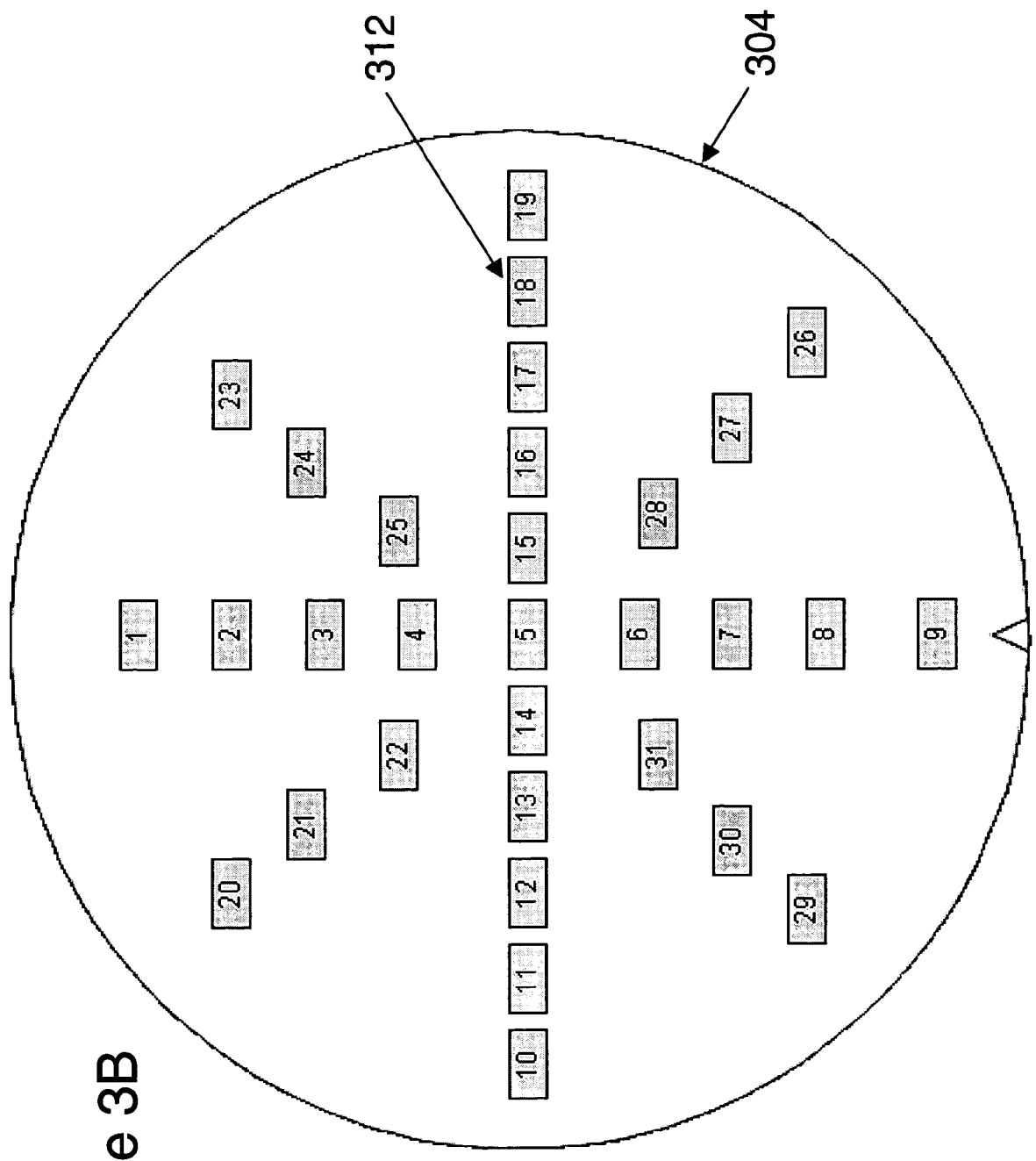
FIG. 3B illustrates 200 mm wafer four-point probe resistance measurement locations according to certain embodiments of the invention.

FIG. 3B illustrates 31 different four-point probe locations 312 on wafer substrate 304 for probing the sheet resistance of nanofabric layer 302 (layer 302 is shown in FIG. 3A) prior to nanotube resistive element patterning. Preferred methods deposit nanofabric layer 302 by spinning an electronic-grade carbon nanotube solution, which includes electronic-grade nanotubes suspended in a coating track-compatible solvent, in a semiconductor fabricator. Thus, nanofabric layer 302 is deposited on a wafer 304 in a semiconductor fabricator using techniques compatible with semiconductor processes (see, e.g., incorporated patent references). Preferred methods include removing the nanofabric fabric edge bead. Although patterned nanotube resistive elements are shown as discrete resistors, patterned resistive elements may also be integrated with integrated circuits. Nanofabric layer 302 is a conformal monolayer approximately 1.5 nm thick and may be introduced at any process level after formation of active devices (CMOS transistors, for example). For example, after devices have been formed, patterned resistive elements may be introduced before metallization layers are deposited and patterned, between metallization layers, on top of the final metallization layer just prior to formation of external contacts. Note that although illustrated on a horizontal planar surface, the conformal properties of a nanotube fabric enables deposition on non-planar surfaces, and even in the vertical direction, on the sidewall of a trench, for example. Preferred methods include four-point probe measurement of nanofabric layer 302 sheet resistance (Ohms-per-square) using Os tips at 0.04 inch spacing, each probe having a 0.04 inch radius, with an applied 45 gram pressure, and 300 microAmperes of current.

Nanotube films with sheet resistance from 1 K-Ohm to 1M-Ohm may be coated routinely and uniformly, but smaller and larger resistances are also contemplated.

Figure 3C:
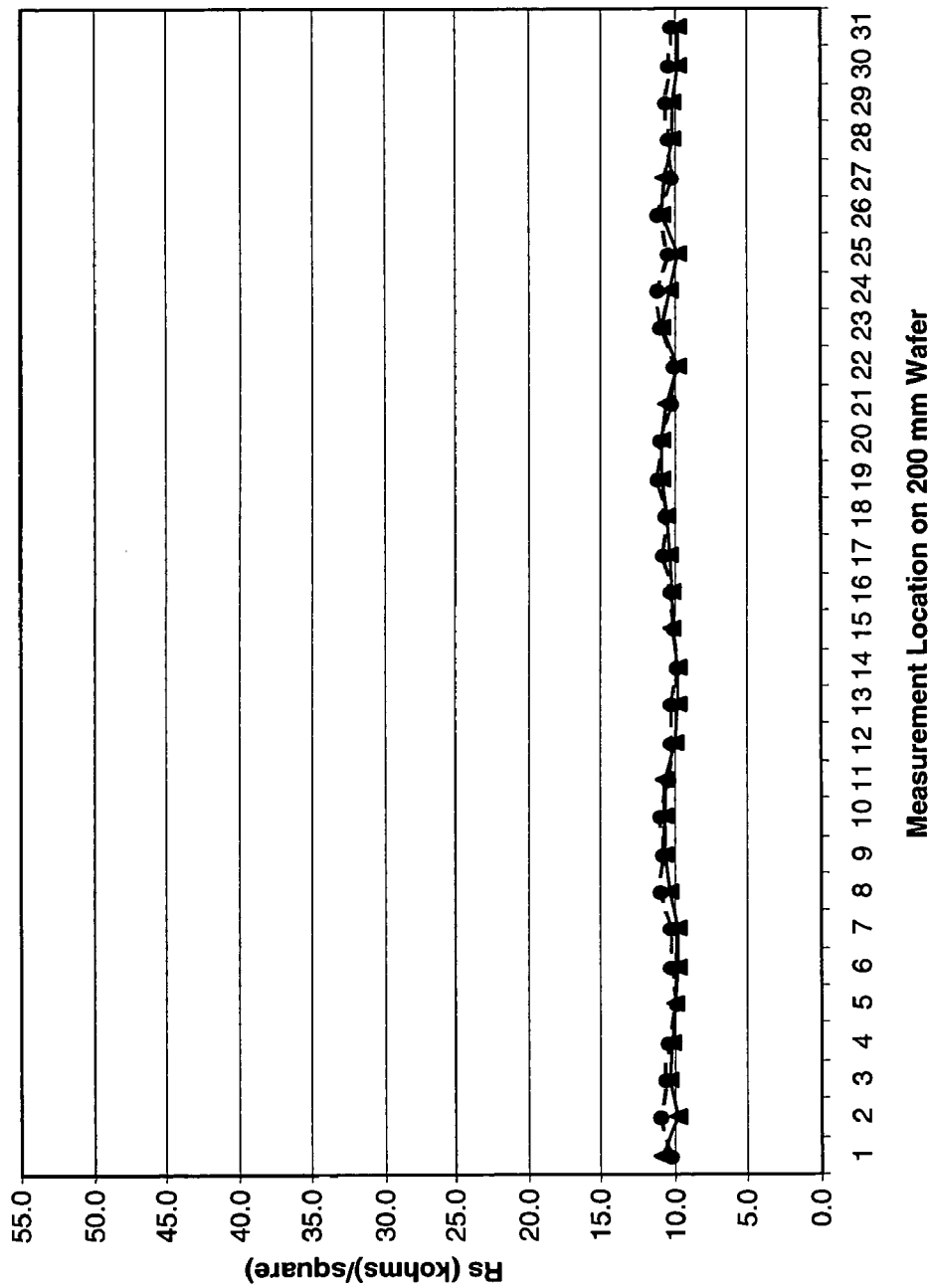
FIG. 3C illustrates 200 mm wafer four-point probe resistance values for two wafers according to certain embodiments of the invention.

FIG. 3C illustrates four-point probe measurement results 320 on two different fabricated 200 mm wafers (data in circles and triangles for the respective wafers). A typical 200 mm wafer yielded sheet resistance values of 11.7±0.4 k-Ohms-per-square (11.7 k-Ohms±3.4%). Resistance values can be trimmed as illustrated in FIG. 2 for even tighter control of resistance variations.

Referring to FIG. 1A, a resistive element 100 having a resistance of 5 M-Ohms, for example, may be designed and fabricated using a nanofabric layer 104 with a sheet resistance of 10 k-Ohm-per-square. A nanofabric layer 104 having a sheet resistance of approximately 10 K-Ohm-per-square typically has approximately 10 nanotubes in a 0.2× 0.2 um region. Assuming a patterned nanotube fabric layer 104 has a width of 2 um, then one square is 2 um×2 um. In order to obtain a resistor value of 5 M-Ohm, 500 squares are required, corresponding to an overall patterned nanofabric layer 104 length between contacts 106 of 1,000 um or 0.1 cm (500 squares times 2 um per square) and a width of 2 um. Each of the two ends of patterned nanofabric layer 104 terminates under electrical contacts 106. Electrical contacts 106 contact individual nanotube fibers in patterned nanofabric layer 104. In this example, for patterned fabric layer 104 selected as 2 um wide with approximately 10 fibers in a 0.2 um×0.2 um area, there are approximately 100 contacts (10×2/0.2) between each electrical contact 106 and the fibers in nanofabric layer 104. Each contact between a fiber and a contact 106 has an associated resistance. The contact resistance per fiber may vary from about 6,500 Ohms to about 100,000 ohms, depending on the material used for contact 106, such as metals, alloys, semiconductors, etc., for example, aluminum, copper, silver, gold, nickel, platinum, palladium, TiW, Cr—Cu—Au, and doped silicon, etc. For 100 fibers, contact resistance at each end of resistive element 100 may vary from 65 ohms to 1,000 ohms. Assuming the maximum contact resistance of 2,000 Ohms (one contact at each end of the resistor), for a 5 M-Ohm nanofabric resistor, the contact resistance is 0.04% and may be ignored for some applications.

Nanofabric fibers are capable of reliability carrying large currents, typically up to 1 mA per micrometer of fabric width, for example. For a 2 um wide patterned fabric, 2 mA can typically be supported. For a 5 M-Ohm resistor element 100 of 2 um width, resistor element 100 can support 20 watts of power ($I^2R$) dissipation and the nanofabric can tolerate about 800 to 1,000 degrees centigrade. This is significantly in excess of the 0.3 to 1 watt power dissipation and 125 degrees centigrade that typical thin film packaged resistors can support.

Figure 4A:
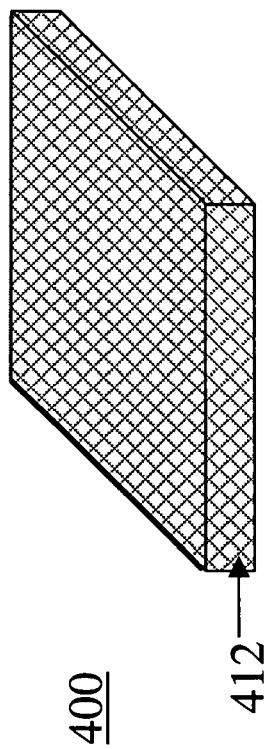
FIGS. 4A and 4B illustrate intermediate structures made in the fabrication of resistive elements according to certain embodiments of the invention.
Figure 4A:
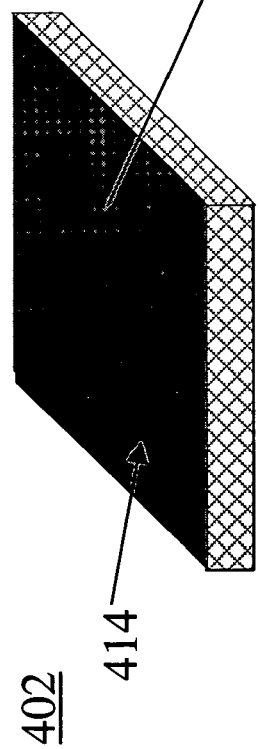
Figure 4A:
Figure 4A:
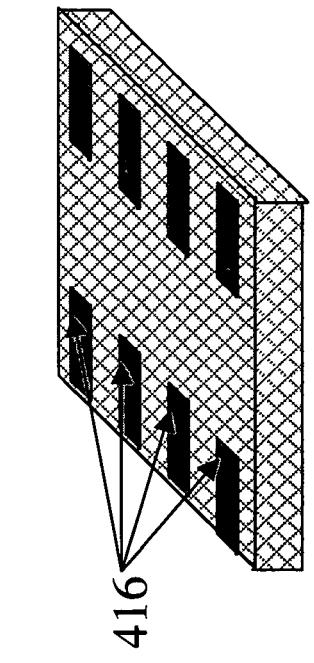
Figure 4B:
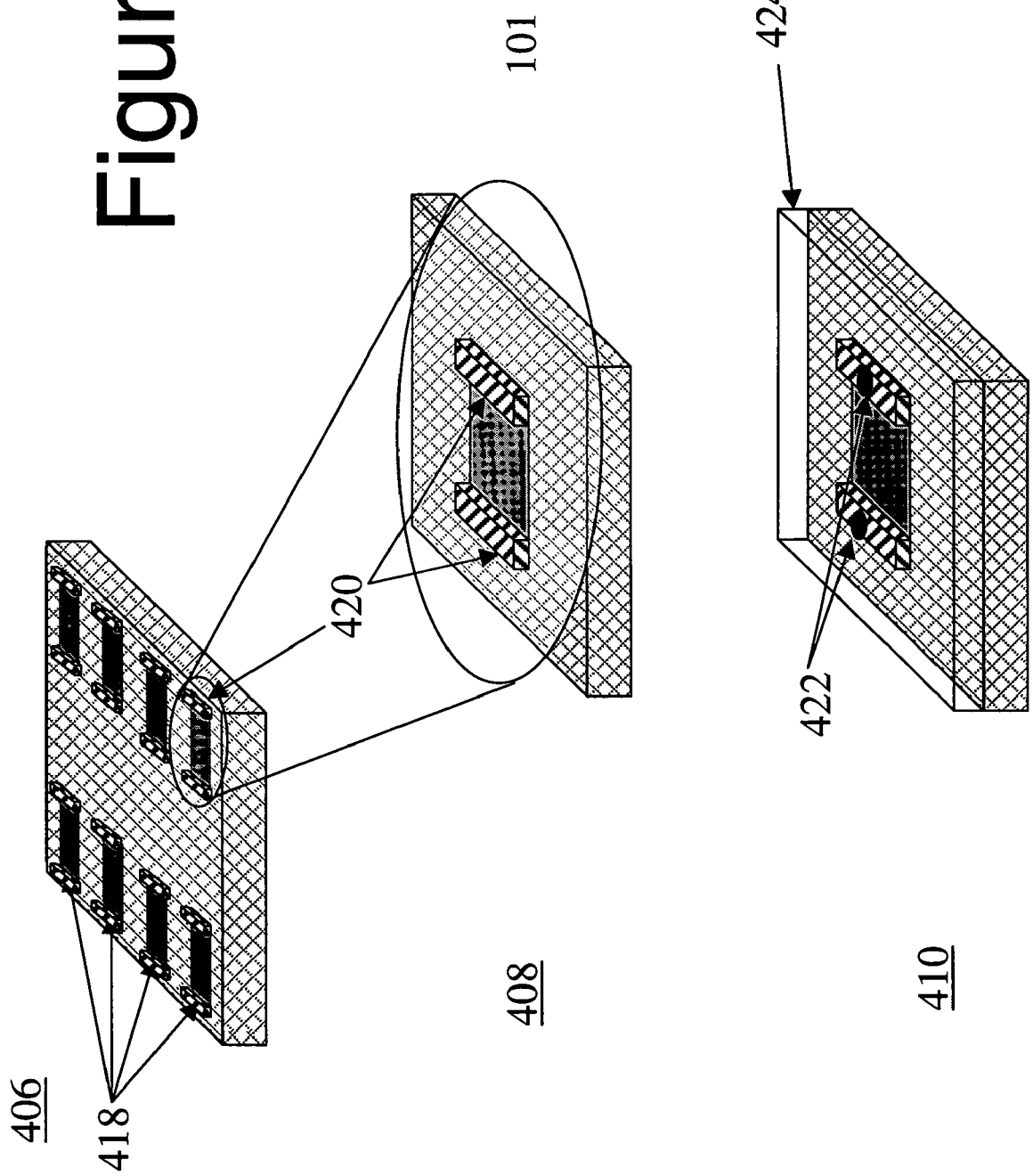

FIGS. 4A and 4B illustrate intermediate structures created in the fabrication of a resistive element according to aspects of the invention.

Intermediate structure 400 shows a substrate 412. A fabric of nanotubes 414 is disposed on substrate 412, as shown in intermediate structure 402; the fabric of nanotubes 412 is shown in micrographic detail in inset 413.

The nanofabric 414 is patterned, e.g. by lithography and etching, leaving patterned resistive elements 416, shown in intermediate structure 404.

Electric contacts 420 are applied to resistive elements 416 as shown in intermediate structure 406, and in exploded view, intermediate structure 408.

Second conductive contacts 422 are applied, and a passivation layer 424 (shown as translucent for clarity) are applied. The second conductive contacts 422 are shown as dots merely for clarity, but they may be any shape necessary according to the final use of the device.

EXAMPLE 2

Figure 5:
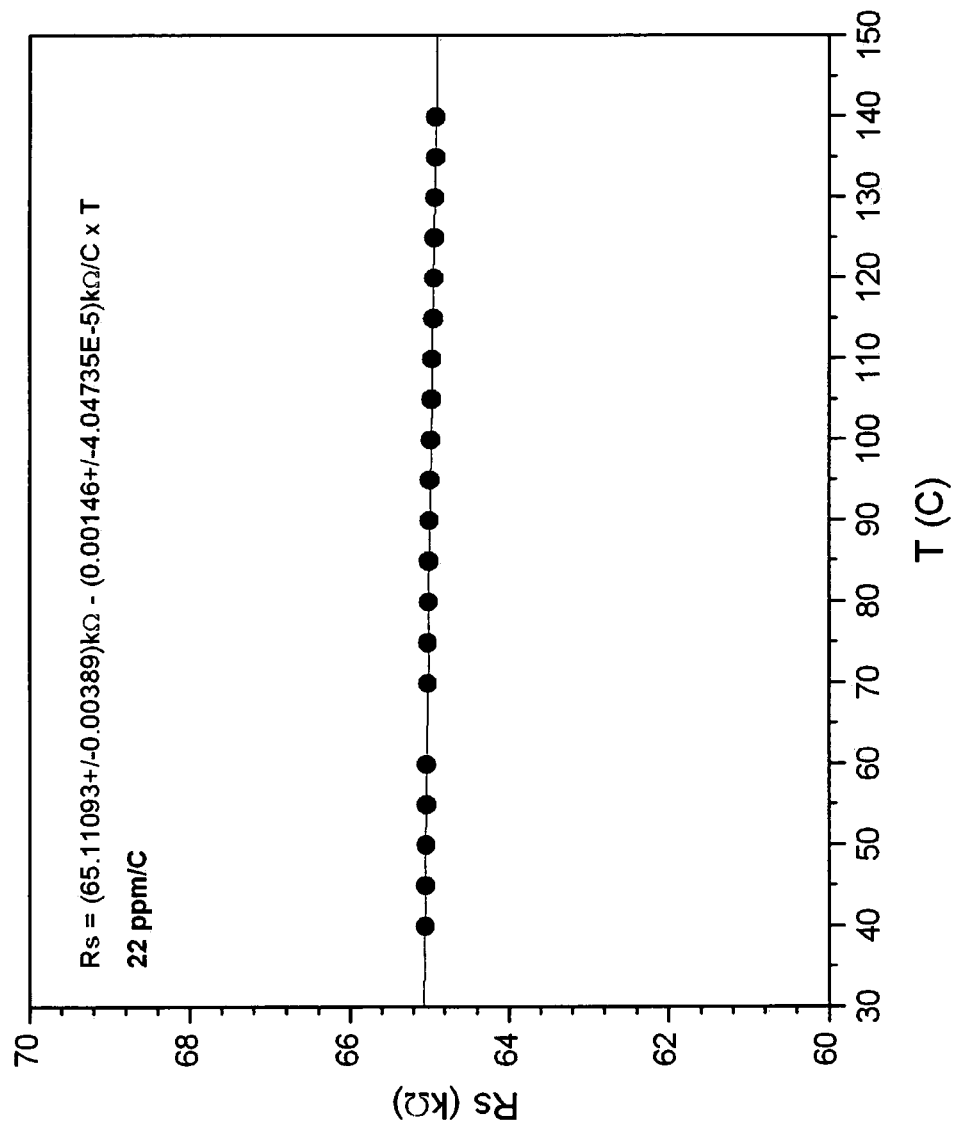
FIG. 5 illustrates a graph showing electrical properties of a resistive element according to certain embodiments of the invention.

A nanofabric layer (nanofabric) was produced and reliably reproduced having a sheet resistance of 65 K-Ohms-per-square. Resistances were measured at temperatures ranging from −40 degrees C. to 140 degrees C. in air. A four-point probe was used (Os tips, at 0.04 inch spacing, each probe had a 0.01 inch radius, 45 grams of pressure applied and 300 uAmps of current). The investigators calculated a TCR for the film of −22 ppm resistance change per degree, as shown in FIG. 5, which is a graph 500 of ambient temperature vs. Kilo-Ohms resistance in the fabric. This measurement was found to be reliably reproducible, and associated electron transport was hypothesized to be quasi-ballistic. In the case of the 5 M-Ohm resistor design described in example 1, for a sheet resistance of 60 K-Ohms-per-square, resistive element 100 (as shown in FIG. 1A) requires 77 squares between contacts, corresponding to 154 um of length, and also 2 um of width. As previously described, contact resistances are negligible. The resistor has a low TCR of −22 ppm/deg-C. A 5 M-Ohm resistive element 100 designed and fabricated using a 65 K-Ohm-per-square nanofabric sheet resistance is 6.5× shorter in length (for the same width) than a 5 M-Ohm resistive element 100 fabricated using a 10 K-Ohm-per-square sheet resistance nanofabric, and is expected to have less parasitic capacitance and inductance (see table 1 below).

The sheet resistance of the nanofabric is related to the number and character of the non-woven nanotube fibers in parallel and in series that make up the nanofabric. Individual nanotube fabrics may exhibit metallic or semiconducting behavior. Metals exhibit positive temperature coefficient of resistance (TCR) and semiconductors exhibit negative TCR. Nanotube fabrics composed of series and parallel combinations of metallic and semiconducting carbon nanotube fibers, with low defect levels, may exhibit quasiballistic behavior. This results in small temperature coefficient of resistance (TCR), less than 25 ppm/deg-C for example. The combination of metallic and semiconductor fibers may result in nanofabric resistance values with a positive TCR of 25 ppm/deg-C or less, for example, or with a negative TCR of −25 ppm/deg-C or less negative, for example, or a TCR of approximately zero if the metallic and semiconductor contributions to TCR approximately cancel out. The proportion of metallic and semiconductor fibers in the nanofabric may be controlled to produce nanofabric resistors with TCR values close to zero, or any desired value. Alternatively, the nanofabric TCR may be adjusted to be positive or negative to offset any TCR contributions from other elements in the device, e.g., between contact elements and nanotube fabrics. For high resistance values, 10 k-Ohms to 100 k-Ohms and higher, for example, contact resistance effects are negligible for most applications.

Resistor manufacturer Honeywell has published data on thin film resistors for M-Ohm, 10 M-Ohm, 20 M-Ohm, and 40 M-Ohms using a thin film of CrSi having sheet resistance of 2,5000-hms-per-square and a TCR of <300 ppm/deg-C, (the data was published on the Honeywell website). The resistance size for these resistance values are much larger than those using patterned SWNT fabric layers and TCRs are higher. Table 1 illustrates an example of dimensions assuming that the CrSi film is also 2 um wide (the comparison may be adjusted for any width).

TABLE 1

| Resistance Value (M-Ohms) | Film Type: CrSi Sheet Resistance: 2,500 Ω/square | Nanofabric Layer Sheet Resistance: 10,000 Ω/square | Nanofabric Layer Sheet Resistance: 65,000 Ω/square |
|---|---|---|---|
| 5 | N = 2,000 squares<br>L = 4,000 um | N = 500 squares<br>L = 1,000 um | N = 77 squares<br>L = 154 um |
| 10 | N = 4,000 squares<br>L = 8,000 um | N = 1,000 squares<br>L = 2,000 um | N = 154 squares<br>L = 308 um |
| 20 | N = 8,000 squares<br>L = 16,000 um | N = 2,000 squares<br>L = 4,000 um | N = 308 squares<br>L = 616 um |
| 40 | N = 16,000 squares<br>L = 32,000 um<br>Largest dimensions; Potentially the largest parasitic capacitances & inductances; | N = 4,000 squares<br>L = 8,000 um | N = 616 squares<br>L = 1,232 um<br>Smallest dimensions; Potentially the smallest parasitic capacitances & inductances |
| | TCM < 300 ppm/° C. | TCM < 25 ppm/° C. | TCM < 25 ppm/° C. |

Resistive elements using nanofabric layers offer the advantages of having a smaller physical size, a lower TCM, ease of integration into existing semiconductor processes, and the potential for less parasitic capacitance and inductance as compared to currently used thin-film based resistors.

Alternate Embodiments

In general, nanotube defects may be minimized (for example through solution-phase processing and coating parameter optimization) in order to provide for near-ballistic conduction and minimized resistance change with temperature.

In some embodiments, the resistive element using carbon nanotubes is a single, discretely packaged resistor.

In some embodiments, the resistive element is packaged using wirebonding. One skilled in the art will understand that wirebond-compatible contact metallurgy that is also compatible with the nanotube contact metallurgy is necessary for proper interconnection of nanotubes, electrodes and contacts. For example, wirebond to Al is commonplace, therefore compatibility of Al with the contact to CNT can be useful, unless Al can be the contact metal to the CNT. Standard encapsulation such as $SiO_2$ and $Si_3N_4$ may be used, for example. Encapsulation material are described above in reference to passivation layer 108.

Figure 6A:
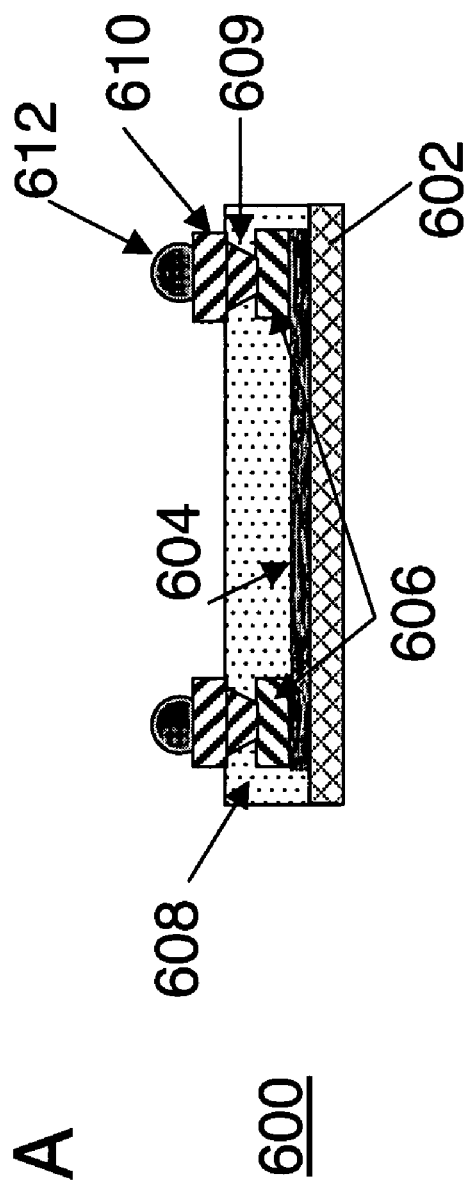
FIGS. 6A and 6B illustrate packaged resistor elements, passivated and bumped, attached to a next level of assembly according to certain embodiments of the invention.
Figure 6B:
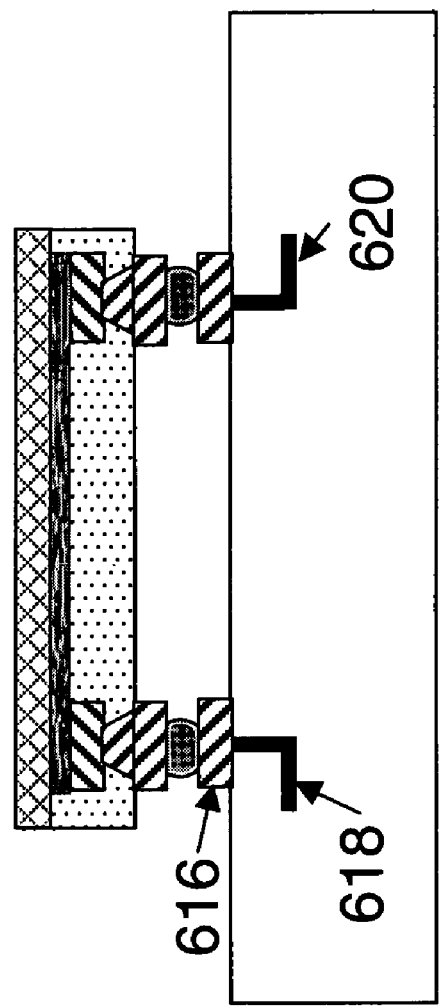

In another embodiment of the present invention, FIGS. 6A and 6B illustrate a nanofabric-based resistive element including bump terminals for electrical connection and mechanical attachment. FIG. 6A illustrates a cross section of encapsulated resistor 600 with conductive bumps for mechanical and electrical connection to the next level of assembly. Substrate 602 may be made of silicon, or other materials as described further below. The patterned nanofabric 604 rests on substrate 602, and is in electrical connection with contact 606. Contact 606 is in electrical contact with terminal metal layer 610 (also referred to as under-bump-metallurgy, UBM) that extends through via hole region 609 to contact 606. Conductive bump 612 contacts terminal metal layer 610 and also the next level of assembly carrier 614 (module, substrate, card, board) having contact terminals 616 and wiring traces 618 and 620. Terminal metal layer 610 and bump 612 are an example of contacts 422 in FIG. 4 and are described further below. In applications where surface mounting is required, or where the inductance needs to be low, then the resistors are made physically small and preferably connected with bump terminals that have 0.25 to 0.5 nH of inductance, for example. Bump terminals may be high melting point solder bumps, low melting point solder bumps, or bumps with no solder such as silver based bumps (quaternary Sn, In, Ag, Cu, for example), conductive-paste based bumps, gold bumps formed using wirebonders and coated with a conductive adhesive, etc. These various bump types need an underlying terminal metallurgy. One example is CrCuAu, another is TiCuAu, etc. Bumps generally should provide electrical and mechanical support. The number of bumps and bump patterns are important to the integrity of the structure. In typical embodiments, care should be taken to ensure that there is not a great difference in the coefficient of thermal expansion (CTE) between the substrate of the resistive element, and the substrate the element attaches to, in order to ensure that there are no problems with mechanical support. For example, an organic board such as FR-4 has a CTE of 18 ppm/deg, polyimide glass is about 12 ppm/deg C, alumina ceramic is about 4-5 ppm/deg C, and silicon is about 3 ppm/deg C. Therefore, if using bumps for mechanical support as well as electrical connection, then under some embodiments of the invention, it would be advantageous to deposit resistive elements on various substrates such as organic FR-4, polyimide glass, alumina ceramic, or silicon and others as well. It should be noted that resistive elements of the present invention may be associated with a wide range of substrate materials, contact metallurgies, terminal metallurgies, etc. Mechanical stress compatibility is designed for package bonding integrity. Nanofabrics can tolerate high levels of stress and large deformity of at least 3% without measurable changing sheet resistance.

Figure 7:
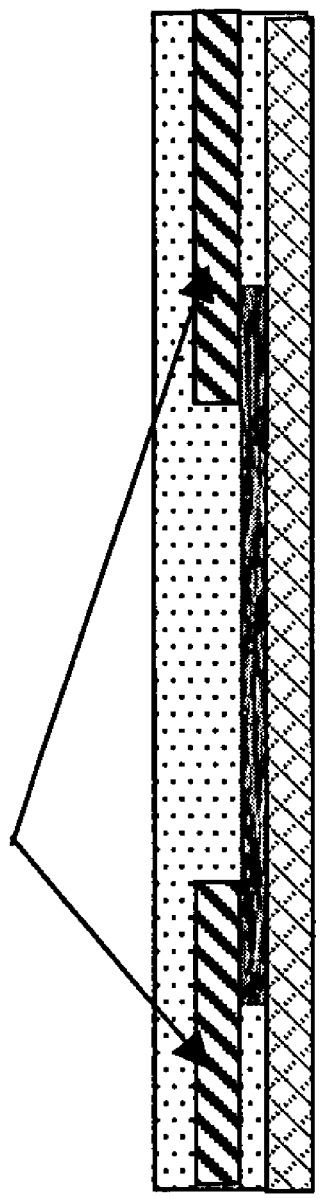
FIG. 7 illustrates an integrated resistor element according to certain embodiments of the invention.

Under other aspects of the invention, numerous resistors are packaged in an integrated circuit, such packaging is especially important in situations where resistance parameter tracking, including temperature coefficient of resistance, is necessary. FIG. 7 illustrates a nanofabric resistor where contacts 606 are extended to form 710, and are part of the wiring of the integrated circuit.

The following patents and applications describe certain techniques for making and using nanotube fabrics and are hereby incorporated by reference in their entireties:

Nanotube Films and Articles (U.S. patent application Ser. No. 10/128,118, now U.S. Pat. No. 6,706,402), filed Apr. 23, 2002; and Methods of Making Carbon Nanotube Films, Layers, Fabrics, Ribbons, Elements and Articles (U.S. patent application Ser. No. 10/341,005), filed Jan. 13, 2003.

While there have been shown and described examples of the present invention, it will be readily apparent to those skilled in the art that various changes and modifications may be made therein without departing from the scope of the invention as defined by the appended claims. Accordingly, the invention is limited only by the following claims and equivalents thereto.

What is claimed is:

1. A resistive element, comprising:
   a patterned region of nanofabric with a predefined area and a pre-selected sheet resistance, the nanofabric having a pre-selected temperature coefficient of resistance (TCR); and
   first and second electrical contacts contacting the patterned region of nanofabric and in spaced relation to each other,
   wherein a total resistance of the resistive element between the first and second electrical contacts is determined by the predefined area of the patterned region of nanofabric, the pre-selected sheet resistance of the patterned region of nanofabric between the first and second electrical contacts, and the pre-selected TCR of the nanofabric, and the spaced relation of the first and second electrical contacts; and
   wherein the total resistance of the resistive element is tunable to a pre-selected total resistance.

2. The resistive element of claim 1, wherein the element has a temperature coefficient of resistance (TCR) that is within the range of about 25 ppm/degree C. to −25 ppm/degree C.

3. The resistive element of claim 1, wherein the nanofabric includes metallic and semiconducting nanotubes in a selected ratio to provide a pre-selected TCR value.

4. The resistive element of claim 3, wherein the ratio is selected to provide TCR value that offsets a TCR value of another element in electrical communication with the resistive element.

5. The resistive element of claim 3, wherein the ratio is selected to provide a TCR value that offsets a TCR value of a contact between the nanofabric and at least one of the first and second electrical contacts.

6. The resistive element of claim 1, wherein the nanofabric includes metallic and semiconducting nanotubes in a selected ratio such that the resistive element has a temperature coefficient of resistance that is about zero ppm/degree C.

7. The resistive element of claim 1, wherein the resistive element carries a current up to about 1 milliamp per micron of a width of the region of nanofabric.

8. The resistive element of claim 1, wherein the pre-selected sheet resistance of the patterned region of nanofabric is at least partially pre-selected by adjusting a porosity of the nanofabric.

9. The resistive element of claim 1, wherein the total resistance of the resistive element is tuned to the pre-selected total resistance by cutting the nanofabric.

10. The resistive element of claim 1, wherein the pre-selected sheet resistance of the patterned region of nanofabric is between 1 k-Ohm/square and 1 M-Ohm/square.

11. The resistive element of claim 1, wherein the pre-selected sheet resistance of the patterned region of nanofabric is at least partially pre-selected by minimizing defects in nanotubes forming the nanofabric.

12. The resistive element of claim 1, wherein opposing ends of the patterned region of nanofabric terminate under the first and second electrical contacts, respectively.

13. The resistive element of claim 1, wherein the first and second electrical contacts comprise metal.

14. The resistive element of claim 1, further comprising at least one contact terminal, wherein the first and second electrical contacts each comprises first and second layers, wherein the first layer contacts the nanofabric and is selected for low contact resistance with the nanofabric, and wherein the second layer contacts an said at least one contact terminal and is selected for good electrical conduction with said at least one contact terminal.

15. The resistive element of claim 14, wherein the first layer comprises at least one of one of tungsten, titanium, chromium, and palladium.

16. The resistive element of claim 14, wherein the second layer comprises at least one of one of tungsten, aluminum, and copper.

17. The resistive element of claim 1, further comprising a passivation layer.

18. The resistive element of claim 1, wherein the resistive element comprises a discretely packaged resistor.

19. The resistive element of claim 1, wherein the resistive element is part of an integrated circuit.

20. The resistive element of claim 1, further comprising at least one contact terminal, wherein electrical communication between the first and second electrical contacts and respective at least one contact terminal is provided through wire bonding.

21. The resistive element of claim 1, further comprising at least one contact terminal, wherein electrical communication between the first and second electrical contacts and respective at least one contact terminal is provided through conductive bumps.

22. The resistive element of claim 1, wherein the nanofabric includes single walled nanotubes.

23. The resistive element of claim 1, wherein the nanofabric includes a conformal monolayer of nanotubes.

24. The resistive element of claim 1, wherein the nanofabric includes metallic nanotubes.

25. The resistive element of claim 1, wherein the nanofabric includes semiconducting nanotubes.

26. The resistive element of claim 1, wherein the nanofabric includes combinations of nanotubes in series.

27. The resistive element of claim 1, wherein the nanofabric includes combinations of nanotubes in parallel.

28. The resistive element of claim 1, wherein the resistive element operates stably at temperatures up to at least about 1000 degrees Celsius.

29. The resistive element of claim 1, wherein the resistive element is laser-scribable.

30. The resistive element of claim 1, wherein the sheet resistance of the patterned region of nanofabric is tunable at least by selecting the porosity of the nanofabric.

31. The resistive element of claim 1, wherein providing the TCR value of the nanofabric is tunable at least by selecting the porosity of the nanofabric.

32. A method of making a resistive element, comprising:
    providing a substrate;
    providing a layer of nanotubes disposed on the substrate, wherein providing the layer comprises selecting a porosity of the layer and further comprises pre-selecting a ratio of metallic and semiconducting nanotubes forming the layer to determine a pre-selected range of values of a temperature coefficient of resistance (TCR) for the resistive element;
    patterning the layer of nanotubes to form a patterned region of nanofabric to provide a pre-selected sheet resistance of the layer;
    providing first and second electrical contacts in contact with the patterned region of nanofabric; and
    tuning a total resistance of the resistive element between the first and second electrical contacts to a pre-selected total resistance.

33. The method of claim 32, wherein pre-selecting the porosity comprises applying the layer of nanotubes with a pre-selected density.

34. The method of claim 32, wherein providing the layer of nanotubes comprises one of chemical vapor deposition, aerosol application, spray coating, dipping, and spin coating.

35. The method of claim 32, wherein tuning the resistance of the resistive element comprises cutting the patterned region of nanofabric.

36. The method of claim 35, wherein cutting the patterned region of nanofabric comprises laser scribing.

37. The method of claim 35, wherein cutting the patterned region of nanofabric comprises mechanical scribing.

38. The method of claim 32, wherein patterning the fabric of nanotubes comprises steps of lithography and etching.

39. The method of claim 32, wherein providing the first and second electrical contacts in contact with the patterned region of nanofabric comprises disposing the first and second electrical contacts at opposing ends of the patterned region of nanofabric.

40. The method of claim 32, wherein providing the first and second electrical contacts comprises sputtering.

41. The method of claim 32, further comprising applying a passivation layer over the patterned region of nanofabric and the first and second electrical contacts.

42. The method of claim 41, further comprising forming first and second holes in the passivation layer over at least a portion of the first and second electrical contacts, respectively.

43. The method of claim 32, wherein pre-selecting a ratio of metallic and semiconducting nanotubes to determine the pre-selected range of TCR values for the resistive element further comprises controllably removing metallic nanotubes.

44. The method of claim 32, wherein a TCR value of the resistive element is determined to be within the pre-selected range of TCR values by obtaining measurements of a total resistance of the resistive element at multiple temperatures and computing the TCR value from the measurements.

45. The method of making a resistive element of claim 32, wherein a total TCR value of the resistive element is tunable at least by selecting the dimensions of the contact area between the patterned region of nanofabric and the first and second electrical contacts.

46. The method of making a resistive element of claim 32, wherein at least one of the first and second electrical contacts comprise a semiconductor material.

47. The method of making a resistive element of claim 32, wherein the layer of nanotubes includes multi-walled nanotubes.

48. The method of making a resistive element of claim 32, wherein a total TCR value of the resistive element is tunable at least by selecting the material of at least one of the first and second electrical contacts in contact with the patterned region of nanofabric.

49. The method of making a resistive element of claim 32, wherein the preselected range of temperature coeffienct of resistance values is about 25 ppm/degree C. to −25 ppm/degree C.

50. The method of making a resistive element of claim 32, wherein at least the ratio of metallic and semiconductive nanotubes forming the layer is selected to provide a TCR value that offsets a TCR value of another element in electrical communication with the resistive element.

51. The method of making a resistive element of claim 32, wherein at least the ratio of metallic and semiconductive nanotubes forming the layer is selected to provide a TCR value that offsets a TCR value of a contact between the patterned region of nanofabric and at least one of the first and second electrical contacts.

52. The method of making a resistive element of claim 32, wherein the ratio of metallic and semiconductive nanotubes forming the layer is selected ratio such to provide a temperature coefficient of resistance of the resistive element that is about zero ppm/degree C.

53. The method of making a resistive element of claim 32, wherein the pre-selected sheet resistance of the layer is between 1 k-Ohm/square and 1 M-Ohm/square.

54. The method of making a resistive element of claim 32, wherein the pre-selected sheet resistance of the layer is at least partially pre-selected by minimizing defects in nanotubes forming the patterned region of nanofabric.

55. The method of making a resistive element of claim 32, wherein opposing ends of the patterned region of nanofabric terminate under the first and second electrical contacts, respectively.

56. The method of making a resistive element of claim 32, wherein the first and second electrical contacts comprise metal.

57. The method of making a resistive element of claim 32, further comprising providing at least one contact terminal, wherein the first and second electrical contacts each comprises first and second layers, wherein the first layer contacts the nanofabric and is selected for low contact resistance with the patterned region of nanofabric, and wherein the second layer contacts said at least one contact terminal and is selected for good electrical conduction with said at least one contact terminal.

58. The method of making a resistive element of claim 57, wherein the first layer comprises at least one of one of tungsten, titanium, chromium, and palladium.

59. The method of making a resistive element of claim 57, wherein the second layer comprises at least one of one of tungsten, aluminum, and copper.

60. The method of making a resistive element of claim 32, further comprising providing at least one contact terminal, wherein electrical communication between the first and second electrical contacts and respective at least one contact terminal is provided through one of wire bonding and conductive bumps.

61. The method of making a resistive element of claim 32, wherein the nanotubes includes single walled nanotubes.

62. The method of making a resistive element of claim 32, wherein the layer of nanotubes includes a conformal monolayer of nanotubes.

63. The method of making a resistive element of claim 32, wherein the resistive element operates stably at temperatures up to at least about 1000 degrees Celsius.

\* \* \* \* \*